(12) United States Patent
Nishikawa et al.

(10) Patent No.: US 7,933,127 B2
(45) Date of Patent: Apr. 26, 2011

(54) MEMORY CARD AND MEMORY CARD MANUFACTURING METHOD

(75) Inventors: Hidenobu Nishikawa, Nara (JP); Hiroyuki Yamada, Osaka (JP); Shuichi Takeda, Yamagata (JP); Atsunobu Iwamoto, Yamagata (JP)

(73) Assignee: Panasonic Corporation, Osaka (JP)

( * ) Notice: Subject to any disclaimer, the term of this patent is extended or adjusted under 35 U.S.C. 154(b) by 412 days.

(21) Appl. No.: 12/160,960

(22) PCT Filed: Jan. 24, 2007

(86) PCT No.: PCT/JP2007/051055
§ 371 (c)(1),
(2), (4) Date: Jul. 15, 2008

(87) PCT Pub. No.: WO2007/088757
PCT Pub. Date: Aug. 9, 2007

(65) Prior Publication Data
US 2010/0157550 A1  Jun. 24, 2010

(30) Foreign Application Priority Data
Feb. 2, 2006  (JP) .................................. 2006-025445

(51) Int. Cl.
*H05K 7/02* (2006.01)
(52) U.S. Cl. .................. 361/735; 257/679; 235/492
(58) Field of Classification Search .................. 361/737, 361/752; 257/679; 235/441, 488, 492
See application file for complete search history.

(56) References Cited

U.S. PATENT DOCUMENTS

| | | | | |
|---|---|---|---|---|
| 4,654,694 | A | * | 3/1987 | Val .................................. 257/665 |
| 5,237,204 | A | * | 8/1993 | Val .................................. 257/698 |
| 5,808,878 | A | * | 9/1998 | Saito et al. ..................... 361/818 |
| 6,125,041 | A | * | 9/2000 | Yoshikawa et al. ............ 361/737 |
| 6,365,963 | B1 | * | 4/2002 | Shimada ........................ 257/686 |
| 6,393,696 | B1 | * | 5/2002 | Yoon et al. ...................... 29/830 |
| 6,573,567 | B1 | * | 6/2003 | Nishizawa et al. ............ 257/358 |
| 6,704,609 | B1 | | 3/2004 | Shen |
| 6,998,292 | B2 | * | 2/2006 | McDonough et al. ......... 438/107 |
| 7,048,197 | B2 | * | 5/2006 | Nishizawa et al. ............ 235/492 |
| 7,224,052 | B2 | * | 5/2007 | Nishizawa et al. ............ 257/679 |
| 7,755,909 | B2 | * | 7/2010 | Kang et al. ..................... 361/764 |
| 2002/0047214 | A1 | | 4/2002 | Morinaga et al. |

FOREIGN PATENT DOCUMENTS

| | | |
|---|---|---|
| JP | 4-167553 | 6/1992 |
| JP | 2001-085610 | 3/2001 |
| JP | 2001-102516 | 4/2001 |
| JP | 2002-109498 | 4/2002 |
| JP | 2002-124625 | 4/2002 |
| JP | 2002-288618 | 10/2002 |
| JP | 2003-108963 | 4/2003 |
| JP | 2004-013738 | 1/2004 |

* cited by examiner

*Primary Examiner* — Dameon E Levi
(74) *Attorney, Agent, or Firm* — McDermott Will & Emery LLP (57) ABSTRACT

A memory card includes a first circuit board, a first semiconductor chip mounted to a top face of the first circuit board with a part of its under face confronting the first circuit board, a second circuit board of which a top face is bonded to a under face of the first circuit board, a second semiconductor chip mounted to the top face of the second circuit board with at least a part of the second semiconductor chip confronting a part of another part other than the part of the under face of the first semiconductor chip, and a cover disposed over the top face of the second circuit board for covering the first semiconductor chip, the first circuit board and the second semiconductor chip.

12 Claims, 5 Drawing Sheets

MEMORY CARD AND MEMORY CARD MANUFACTURING METHOD

RELATED APPLICATIONS

This application is the U.S. National Phase under 35 U.S.C. §371 of International Application No. PCT/JP2007/051055, filed on Jan. 24, 2007, which in turn claims the benefit of Japanese Application No. 2006-025445, filed on Feb. 2, 2006, the disclosures of which Applications are incorporated by reference herein.

TECHNICAL FIELD

The present invention relates to a memory card and a memory card manufacturing method.

BACKGROUND ART

A memory card with a memory chip built therein has been known as one of recording media for storing information. Since the memory card is excellent in portability, it has been widely used as a recording medium of portable electronic devices such as a portable information terminal or a cell phone.

These portable electronic devices have been downsized and increased their memory capacity year by year in order to improve the portability. This market trend requires the memory card to be downsized and have a greater capacity. In general, the memory card is specified its shape, size, and thickness by the industry standard, so that the memory card must meet this standard before it achieves the greater capacity.

To meet the foregoing requirements, a plurality of boards on which memory chips are mounted is layered on one face of a base board, and a control chip for controlling the operation of the memory chips is mounted on the other face thereof. This structure allows increasing a capacity of the memory card. This technique is disclosed in, e.g. patent document 1.

Here is another technique: On a memory chip mounted on a lead frame, another memory chip is layered but shifted therefrom. The electrodes of these two memory chips and an electrode of a control chip mounted on the lead frame are coupled to the lead frame via a gold wire, so that the thickness of the memory card can be reduced. This technique is disclosed in, e.g. patent document 2.

However, the memory card disclosed in patent document 1 is limited to decrease its thickness because of the following reason: The memory chips and the control chip are mounted on different faces of the base board, and the memory boards on which the memory chips are mounted are layered together.

The memory card disclosed in patent document 2 has some restrictions: The memory chips and the control chip are mounted onto the board by a wire bonding method, so that the chips, wires, and lead frame need to be sealed with thermosetting resin after they are mounted. At this time, a sealing layer is to be thick enough for covering the memory chips and the wires, so that the memory card is limited to be downsized or to be thinner. Since a sealing step is needed in addition to the mounting step, a reduction in the manufacturing cost is limited. On top of that, the quality of mounting of respective chips cannot be inspected before all the chips are mounted to the lead frame, so that if parts of chips are defective, they cannot be detected before all the chips are mounted. The manufacturing cost is thus obliged to increase.

Patent document 1: Unexamined Japanese Patent Publication No. 2003-108963
Patent document 2: Unexamined Japanese Patent Publication No. 2004-13738

DISCLOSURE OF INVENTION

A memory card of the present invention comprises the following elements:
- a first circuit board;
- a first semiconductor chip mounted to a top face of the first circuit board such that only a part of an under face of the first semiconductor chip confronts the first circuit board;
- a second circuit board of which top face is bonded to an under face of the first circuit board;
- a second semiconductor chip mounted on a top face of the second circuit board such that at least a part of the second semiconductor chip confronts a part of another part other than the part of the under face of the first semiconductor chip; and
- a cover disposed over the top face of the second circuit board for covering the first semiconductor chip, the first circuit board, and the second semiconductor chip.

The foregoing structure allows overlaying the first semiconductor chip over the second semiconductor chip without inserting a circuit board therebetween, so that the memory card can be downsized and a thickness of the memory card can be reduced.

A method of manufacturing the memory card of the present invention comprises:
(a) mounting the first semiconductor chip on the top face of the first circuit board with only a part of the under face of the first semiconductor chip confronting the first circuit board;
(b) mounting the second semiconductor chip on the top face of the second circuit board;
(c) bonding the second semiconductor chip on the top face of the second circuit board with at least a part of the second semiconductor chip confronting a part of another part other than the part of the under face of the first semiconductor chip; and
(d) covering the first semiconductor chip, the first circuit board, and the second circuit board with the cover disposed over the top face of the second circuit board.

This method allows manufacturing the memory card in a simply way at a better productivity and downsizing the memory card as well as reducing a thickness of the memory card.

DESCRIPTION OF REFERENCE MARKS 1, 1a, 1b. memory card
2, 2a, 2b. first circuit board
3. first semiconductor chip
4. second circuit board
5. second semiconductor chip
6. chip component
7, 7a. cover
8. fixing member
20. opening
21, 41, 51, 52. top face
22, 32, 42. under face
33, 53. bump
34, 54. sealing resin
71. recess
211, 221, 411, 412, 413. electrode
421. external electrode
S11-S22. step

DESCRIPTION OF PREFERRED EMBODIMENTS

Exemplary embodiments of the present invention are demonstrated hereinafter with reference to the accompanying drawings. Similar elements in the exemplary embodiments have the same reference marks and the descriptions thereof are sometimes omitted.

First Exemplary Embodiment

Figure 1:
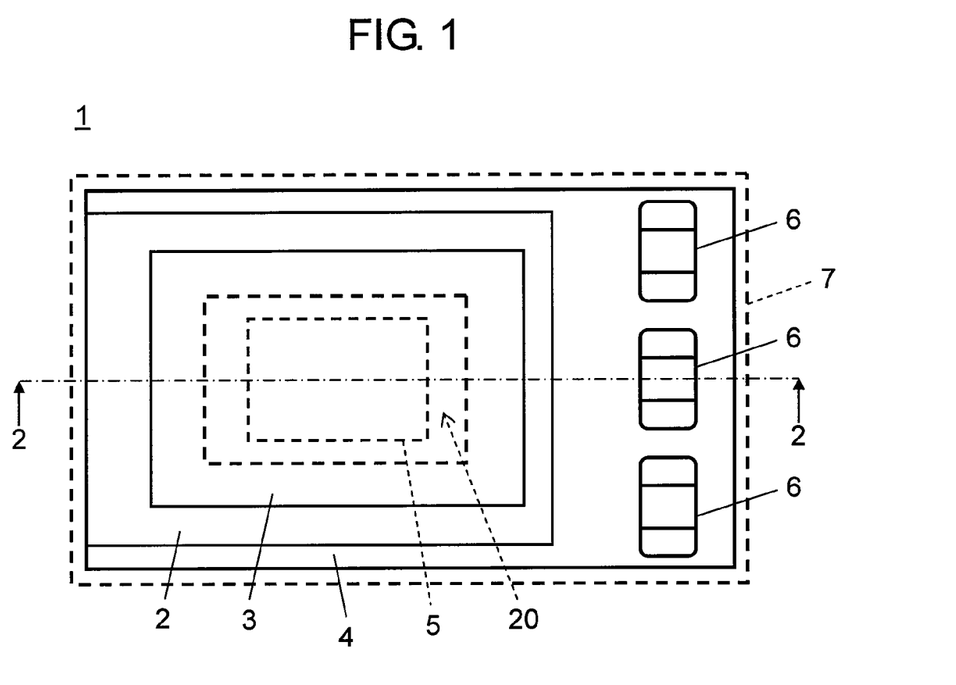
FIG. 1 shows a plan view illustrating a structure of a memory card in accordance with a first exemplary embodiment of the present invention.
Figure 2:
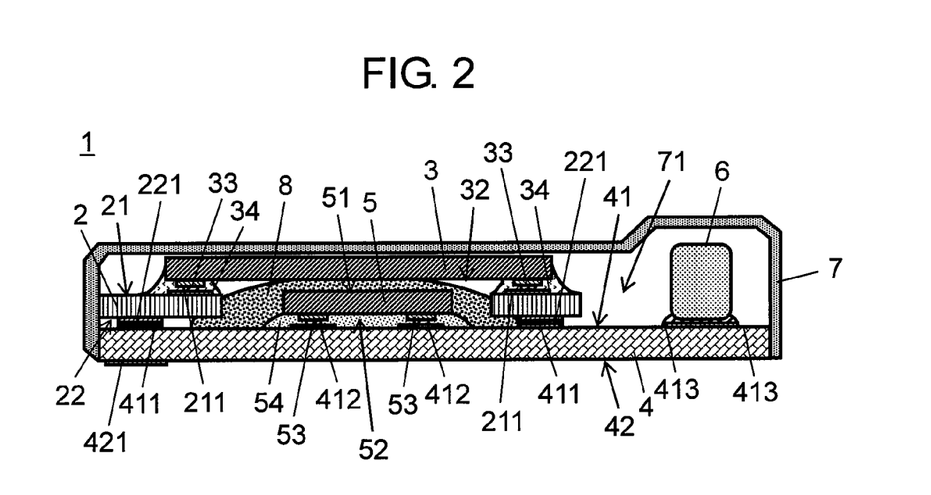
FIG. 2 shows a sectional view cut along line 2-2 in FIG. 1.

FIG. 1 shows a plan view illustrating a structure of a memory card in accordance with the first exemplary embodiment of the present invention. FIG. 2 shows a sectional view of the memory card cut along line 2-2 in FIG. 1. In FIG. 1, cover 7 is shown only its outline with dotted lines for clearly showing the interior structure of memory card 1, and sealing resin to be used for mounting a semiconductor chip is not shown.

In this exemplary embodiment, an SD (Secure Digital) memory card is taken as an example of memory card 1. Memory card 1 has the following typical dimensions:

Length: between 14.9 mm and 15.1 mm, (horizontal direction in FIG. 1)

Width: between 10.9 mm and 11.1 mm (vertical direction in FIG. 1)

Thickness: between 0.9 mm and 1.1 mm. (vertical direction in FIG. 2)

Memory card 1 used in this exemplary embodiment has dimensions of 15 mm (L), 11 mm (W) and 1 mm (T). For a convenient purpose of description, an upper side and a lower side in FIG. 2 are referred to as an upper side and a lower side of memory card 1. The second exemplary embodiment also uses this naming system.

As shown in FIG. 1 and FIG. 2, memory card 1 comprises the following elements:

first circuit board 2 shaped like a picture frame, namely, its outer circumference and inner circumference form rectangles respectively;

first semiconductor chip 3 mounted to top face 21 shown in FIG. 2, i.e. the principal face, of first circuit board 2 with ball bump 33 sandwiched between top face 21 and first semiconductor chip 3 (the ball bump is called a stud bump, and hereinafter simply referred to as "bump");

second circuit board 4 of which top face 41 is bonded to under face 22 of first circuit board 2;

second semiconductor chip 5 mounted on top face 41 of second circuit board 4 with bump 53 sandwiched between top face 41 and second semiconductor chip 5;

chip component 6, including small components such as resistors, soldered to top face 41 of second circuit board 4; and cover 7 disposed over top face 41 of second circuit board 4 for covering first semiconductor chip 3, first circuit board 2, second semiconductor chip 5, and chip component 6.

The thickness of memory card 1 at a section, where first semiconductor chip 3 and second semiconductor chip 5 are mounted, ranges from not smaller than 0.6 mm to not greater than 0.8 mm (in this exemplary embodiment the thickness is 0.7 mm).

Second circuit board 4 is made from glass epoxy (FR-4.5 equivalent) and has a thickness ranging from not smaller than 01.mm to not greater than 0.4 mm (in this exemplary embodiment, the thickness is 0.16 mm). As shown in FIG. 2, second circuit board 4 includes electrodes 411, 412, and 413 on its top face 41. Electrodes 411 bond to first circuit board 2, electrodes 412 bond to second semiconductor chip 5, and electrodes 413 bond to chip component 6. Second circuit board 4 further includes a plurality of external electrodes 421 on its under face 42 for connecting to external electronic devices. External electrodes 421 are electrically coupled to wirings formed on top face 41 of second circuit board 4 via through holes (not shown) coupling between under face 42 and top face 41.

The thickness of first circuit board 2 ranges from not smaller than 0.1 mm to not greater than 0.4 mm (in this exemplary embodiment, the thickness is 0.12 mm). First circuit board 2 includes a plurality of electrodes 211 on its top face 21 and along the inner circumference for bonding to first semiconductor chip 3. First circuit board 2 also includes electrode 221 on its under face 22, and electrode 221 is soldered to electrode 411 formed on top face 41 of second circuit board 4.

First semiconductor chip 3 and second semiconductor chip 5 are bare chips and have thickness ranging from not smaller than 0.05 mm to not greater than 0.3 mm. First semiconductor chip 3 is a memory chip for storing information, and second semiconductor chip 5 is a control chip for controlling first semiconductor chip 3. First semiconductor chip 3 includes bump 33 formed on an electrode of under face 32, and sealing resin 34 bonds bump 33 to electrode 211 of first circuit board 2 (including a state where a contact therebetween is kept). Second semiconductor chip 5 includes bump 53 formed on an electrode of under face 52, and sealing resin 54 bonds bump 53 to electrode 412 of second circuit board 4 (including a state where a contact therebetween is kept).

In this exemplary embodiment, sealing resin 34, 54 employ non-conductive film (NCF) made of resin such as film-like resin material stuck onto top face 21 of first circuit board 2 or top face 41 of second circuit board 4. Sealing resin 34 existing between first semiconductor chip 3 and first circuit board 2 surrounds bump 33. Sealing resin 54 between second semiconductor chip 5 and second circuit board 4 surrounds bump 53.

Under face 32 of first semiconductor chip 3 shapes like a rectangle, and only a section shaped like a picture frame and formed along the outer circumference of under face 32 confronts first circuit board 2 (this section is a vicinity area of the two pairs of edges, each edge of one pair facing to each other, of under face 32). In other words, only a part of under face 32 of first semiconductor chip 3 confronts top face 21 of first circuit board 2 in memory card 1.

Second semiconductor chip 5 is placed inside of first circuit board 2 with a clearance from the inner circumference of first circuit board 2 (refer to rectangular opening 20 of first circuit board 2 shown in FIG. 1). Top face 51 of second semiconductor chip 5 confronts under face 32 of first semiconductor chip 3 at the vicinity of the center of under face 32 (more specifically a part of another part other than the foregoing part confronting first circuit board 2).

Memory card 1 further includes fixing member 8 disposed between under face 32 of first semiconductor chip 3 and top face 51 of second semiconductor chip 5 as shown in FIG. 2. Fixing member 8 works as adhesive for fixing first semiconductor chip 3 and second semiconductor chip 5 to each other.

Cover 7 is formed of molded components made of resin and includes recess 71 which accommodates first semiconductor chip 3, first circuit board 2, second semiconductor chip 5, and chip component 6. Cover 7 is mounted to second circuit board 4 by using an opening of recess 71.

Figure 3A:
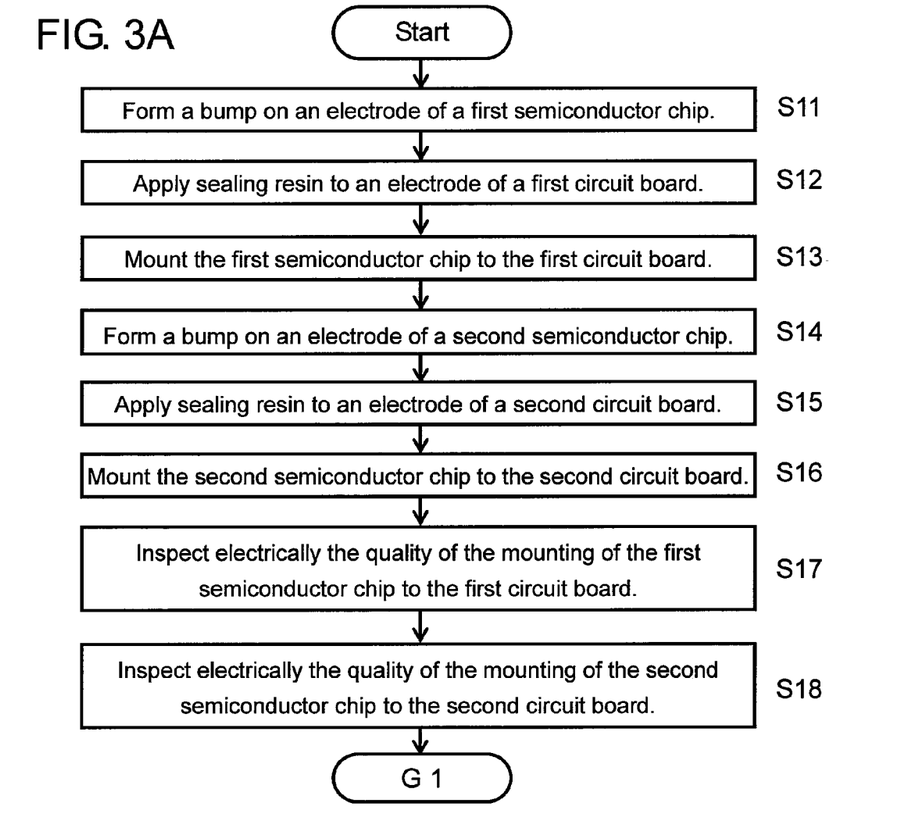
FIG. 3A shows a flowchart illustrating a method of manufacturing the memory card in accordance with the first exemplary embodiment of the present invention.
Figure 3B:
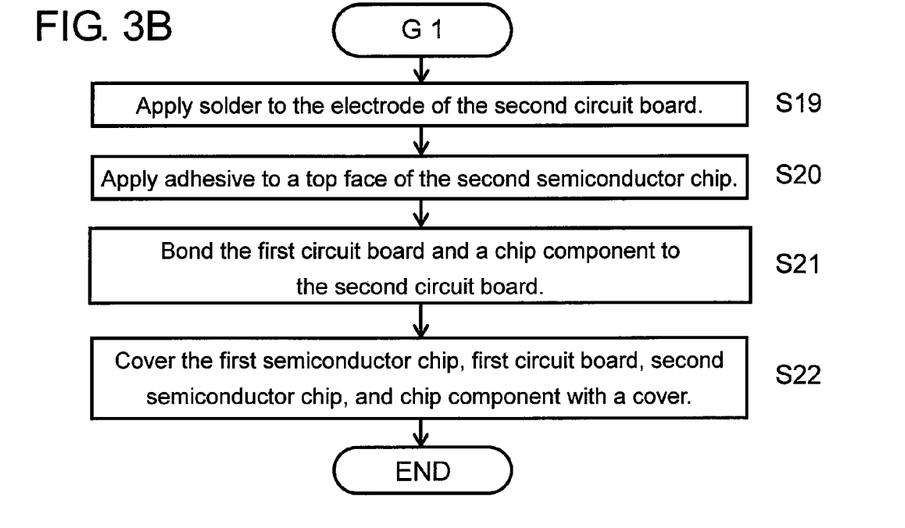
FIG. 3B shows a flowchart illustrating a manufacturing method of the memory card in accordance with the first exemplary embodiment of the present invention.
Figure 4A:
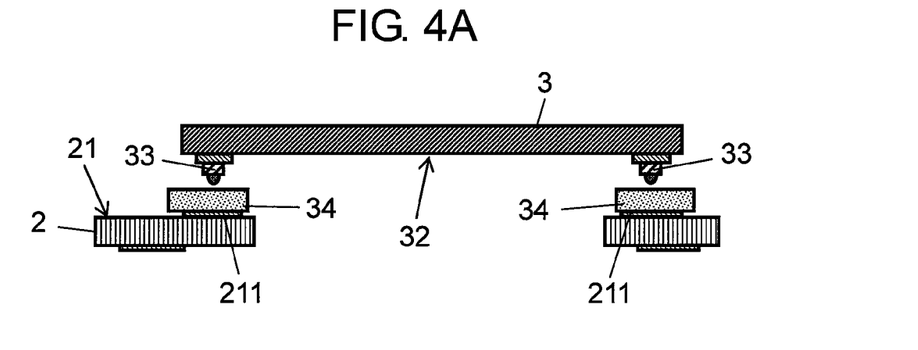
FIG. 4A shows a some step of the manufacturing method of the memory card in accordance with the first exemplary embodiment of the present invention.
Figure 4B:
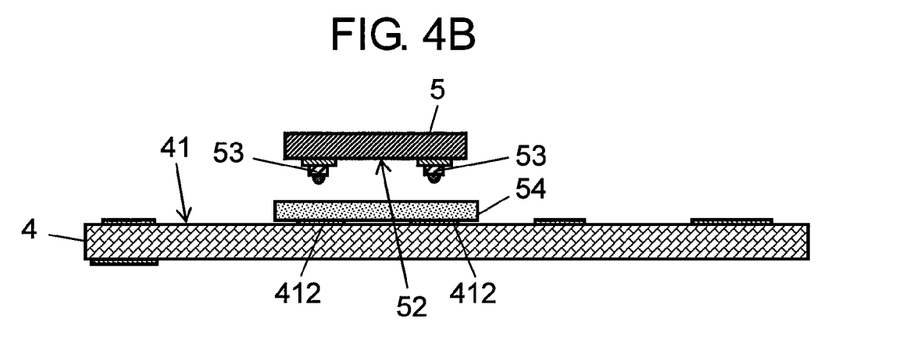
FIG. 4B shows another some step of in the manufacturing method of the memory card in accordance with the first exemplary embodiment of the present invention.
Figure 4C:
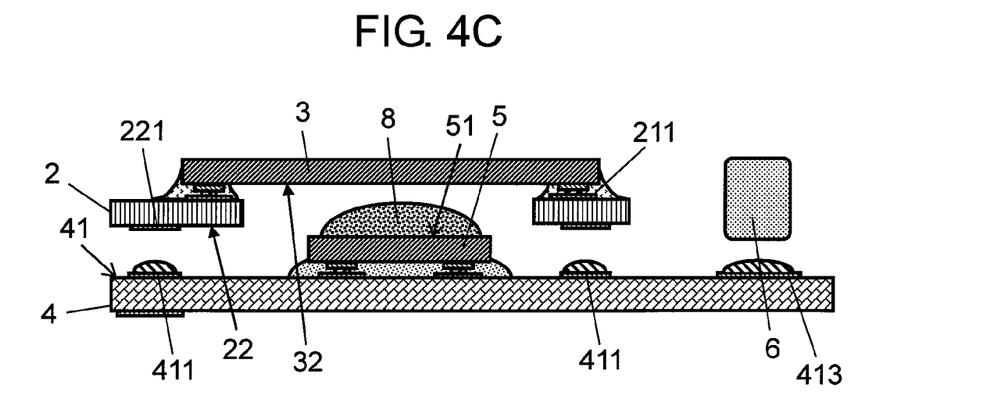
FIG. 4C shows yet another some step of the manufacturing method of the memory card in accordance with the first exemplary embodiment of the present invention.

A method of manufacturing memory card 1 in accordance with this first exemplary embodiment of the present invention is demonstrated hereinafter. FIGS. 3A and 3B show flowcharts of the manufacturing method of memory card 1. FIG. 4A-FIG. 4C show a some step of the manufacturing method with sectional views of memory card 1 similar to the one shown in FIG. 2 cut along line 2-2 in FIG. 1.

First, as shown in FIG. 4A, form bump 33 on an electrode formed on under face 32 of first semiconductor chip 3 (step S11). Then stick sealing resin 34 such as NCF onto electrode 211 formed on top face 21 of first circuit board 2, so that sealing resin 34 is applied to electrode 211 (step S12).

Next, hold first semiconductor chip 3 with a mounting device (not shown) such that under face 32 of first semiconductor chip 3 confronts top face 21 of first circuit board 2. Then adjust a position of first semiconductor chip 3 such that bump 33 confronts electrode 211 via sealing resin 34, and then urge first semiconductor chip 3 against first circuit board 2. At this time, only a part (a section shaped like a picture frame along the outer circumference of under face 32) of under face 32 of first semiconductor chip 3 confronts top face 21 of first circuit board 2. Then heat first semiconductor chip 3 with first semiconductor chip 3 urged against first circuit board 2, and first semiconductor chip 3 is electrically coupled to first circuit board 2 via bump 33. The heat hardens sealing resin 34, thereby bonding first semiconductor chip 3 to first circuit board 2, namely, first semiconductor chip 3 is mounted to first circuit board 2 (step S13). Hereinafter, first circuit board 2 with first semiconductor chip 3 mounted thereon is referred to as a memory module.

Step S11-step S13 discussed above allow mounting first semiconductor chip 3 onto top face 21 of first circuit board 2 with only a part of under face 32 of first semiconductor chip 3 confronting first circuit board 2.

Next, as shown in FIG. 4B, form bump 53 on an electrode formed on under face 52 of second semiconductor chip 5 (step S14). Then stick sealing resin 54 such as NCF onto electrode 412 formed on top face 41 of second circuit board 4, so that sealing resin 54 is applied to electrode 412 (step S15).

Next, hold second semiconductor chip 5 with its under face 52 confronting top face 41 of second circuit board 4 by using a holder of the mounting device. Then adjust a position of second semiconductor chip 5 such that bump 53 confronts electrode 412 via sealing resin 54. Then heat second semiconductor chip 5 while second semiconductor chip 5 is urged against second circuit board 4, and second semiconductor chip 5 is electrically coupled to second circuit board 4 with bump 53 therebetween. The heat hardens sealing resin 54, thereby bonding second semiconductor chip 5 to second circuit board 4, namely, second semiconductor chip 5 is mounted to second circuit board 4 (step S16). Hereinafter, second circuit board 4 with second semiconductor chip 5 mounted thereon is referred to as a control module. Step S14-step S16 discussed above allow mounting second semiconductor chip 5 onto top face 41 of second circuit board 4.

Next, inspect the memory module and the control module with an inspection device (not shown). To be more specific, apply an electric current to the memory module via first circuit board 2, thereby judging the quality of mounting of first semiconductor chip 3 to first circuit board 2, e.g. good or bad of electrical connection between first semiconductor chip 3 and first circuit board 2, or performance of first semiconductor chip 3 is electrically inspected (step S17). Run an electric current to the control module via second circuit board 4, thereby electrically inspecting the quality of mounting of second semiconductor chip 5 to second circuit board 4 (step S18).

After the inspection results in normal mounting of the memory module and control module, apply cream solder onto top face 41 of second circuit board 4 via a mask as shown in FIG. 4C, so that the cream solder is applied onto electrodes 411 and 413 (step S19). Then apply fixing member 8 such as adhesive onto top face 51 of second semiconductor chip 5 (step S20).

Next, adjust a position of first circuit board 2 such that electrode 221 on under face 22 of first circuit board 2 confronts electrode 411 of second circuit board 4 via the solder. Then mount first circuit board 2 onto second circuit board 4. In a similar way, mount chip component 6 onto electrode 413 formed on second circuit board 4 with solder. At this time, fixing member 8 on top face 51 of second semiconductor chip 5 is urged by under face 32 of first semiconductor chip 3, so that fixing member 8 spreads from the space between first semiconductor chip 3 and second semiconductor chip 5 into the space around second semiconductor chip 5 as shown in FIG. 2, and fixing member 8 hardens in this state. Then the memory module, the control module and chip component 6 undergo a reflow process. These steps discussed above allow bonding electrode 221 on under face 22 of first circuit board 2 to electrode 411 on top face 41 of second circuit board 4 while a vicinity area of a typical center section of under face 32 of first semiconductor chip 3 confronts top face 51 of second semiconductor chip 5. The typical center area refers to a part of another area than the part of under face 32 confronting first circuit board 2. On top of that, the electrode of chip component 6 is bonded to electrode 413 of second circuit board 4 (step S21).

Next, mount cover 7 to second circuit board 4, where the memory module and chip component 6 are bonded, by using the opening of recess 71. This structure allows covering first semiconductor chip 3, first circuit board 2, second semiconductor chip 5, and chip component 6 with cover 7, so that memory card 1 is completed (step S22).

On top of that, in the case of detecting a defective mounting of first semiconductor chip 3 to first circuit board 2 in step S17, another normal memory module is prepared for the defective one, and normal modules are bonded together. In a similar way, if a defective mounting of second semiconductor chip 5 to second circuit board 4 is detected, another normal control module is prepared for the detective one, and normal modules are bonded together. The defective modules undergo a repair work, e.g. releasing the bonding of semiconductor chips, or remounting the chips.

As discussed above, according to the first exemplary embodiment, only a part of under face 32 of first semiconductor chip 3 is mounted to top face 21 of first circuit board 2 confronting first semiconductor chip 3. Then first circuit board 2 is bonded to top face 41 of second circuit board 4, whereby under face 32 of first semiconductor chip 3 confronts second semiconductor chip 5 mounted on top face 41 of second circuit board 4 at a part of another part than the foregoing part of under face 32. As a result, first semiconductor chip 3 is layered on second semiconductor chip 5 without inserting another circuit board therebetween, and memory card 1 thus can be downsized and the thickness thereof can be reduced.

According to also the first exemplary embodiment, first semiconductor chip 3 is mounted to first circuit board 2 to form a module, and second semiconductor chip 5 is mounted to second circuit board 4 to form another module. Then these modules are layered together. This structure allows inspecting electrically the respective modules before they are layered, so that the quality of the mounting of first semiconductor chip 3 and second semiconductor chip 5 can be judged independently. As a result, a mounting defective can be detected before the memory module is layered onto the control module, and the manufacturing cost can be lowered.

According to conventional art, in the case of mounting a semiconductor chip onto a circuit board by the wire bonding method, the semiconductor chip and the wire need to be sealed with thermosetting resin having a low viscosity after the semiconductor chip is mounted. Thus the thermosetting resin is molded on the top face of the circuit board to cover the semiconductor chips and so on, so that the thermosetting resin sometimes works as a cover of a memory card.

In the first exemplary embodiment, on the other hand, first semiconductor chip 3 and second semiconductor chip 5 are mounted in a flip-chip manner onto first circuit board 2 and second circuit board 4 respectively with bumps 33 and 53 sandwiched therebetween. This structure not always needs to seal first semiconductor chip 3, second semiconductor chip 5 and first circuit board 2 with thermosetting resin, or to form a cover by using the thermosetting resin. As a result, a degree of freedom increases for selecting a material or a manufacturing method of the cover. Further, the flip-chip mounting method expects higher reliability than the wire bonding mounting method. On top of that, since first semiconductor chip 3 and second semiconductor chip 5 are mounted onto the respective circuit boards via sealing resin 34 and 54, it is not needed to seal electrical connections between respective semiconductor chips and circuit boards, so that the number of manufacturing steps of memory card 1 can be reduced. In this exemplary embodiment, cover 7 formed of molded components covers first semiconductor chip 3, second semiconductor chip 5 and first circuit board 2. This structure allows simplifying the manufacture of memory card 1 comparing with the structure where a cover is formed by sealing those elements with the thermosetting resin.

In this first exemplary embodiment, first semiconductor chip 3 is bonded to first circuit board 2 at the section shaped like a picture frame along the outer circumference of its under face 32, so that first semiconductor chip 3 can be rigidly mounted to first circuit board 2. First semiconductor chip 3 is further fixed to top face 51 of second semiconductor chip 5 at its under face 32 with fixing member 8 made of adhesive, so that first semiconductor chip 3 can be further rigidly fixed, although indirectly, to second circuit board 4.

Second Exemplary Embodiment

Figure 5:
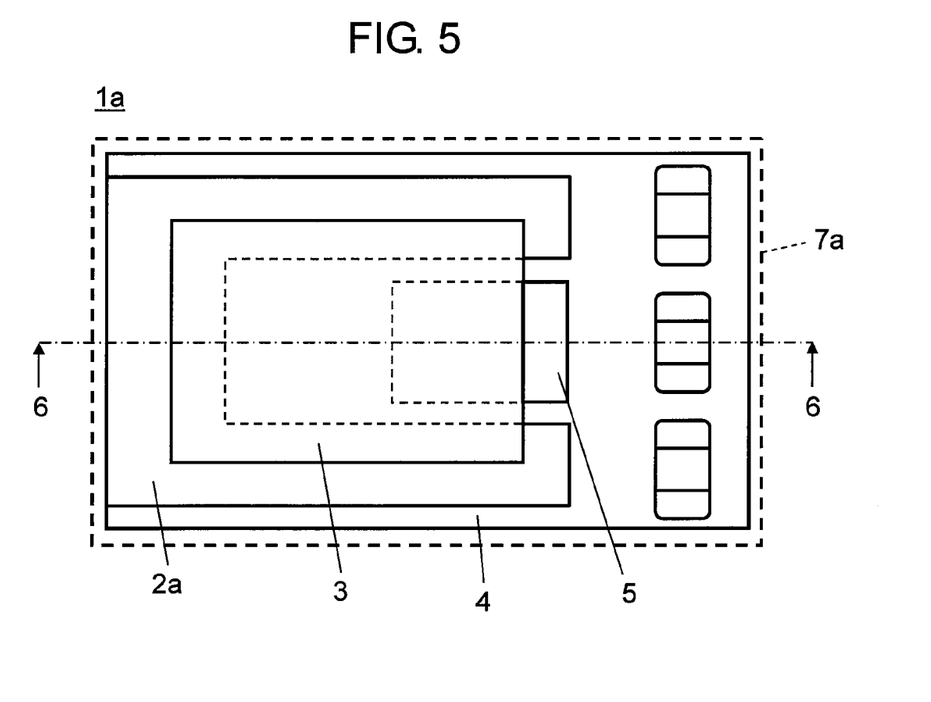
FIG. 5 shows a plan view illustrating a structure of a memory card in accordance with a second exemplary embodiment of the present invention.
Figure 6:
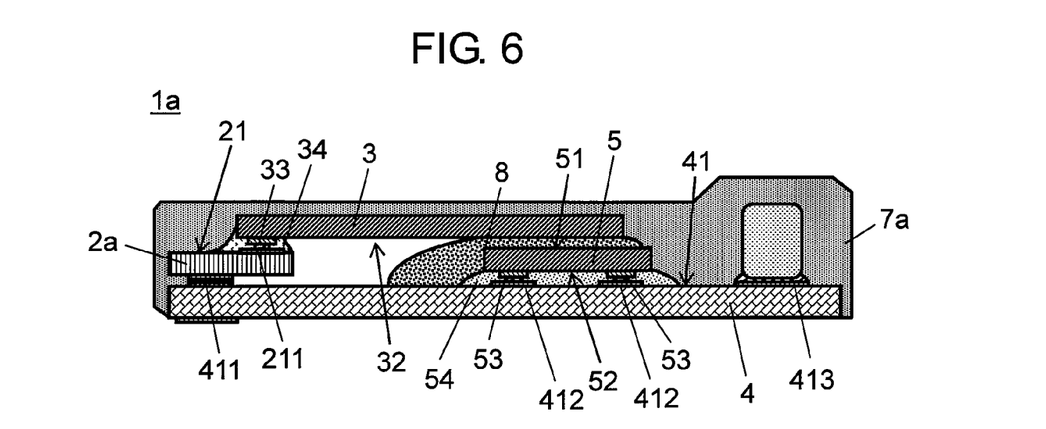
FIG. 6 shows a sectional view cut along line 6-6 in FIG. 5.

A memory card in accordance with the second exemplary embodiment of the present invention is demonstrated hereinafter with reference to FIG. 5 and FIG. 6. FIG. 5 shows a plan view illustrating a structure of memory card 1a in accordance with the second exemplary embodiment of the present invention. FIG. 6 shows a sectional view of memory card 1a cut along line 6-6 in FIG. 5. In FIG. 5, cover 7a is drawn only its outline with broken lines in order to show the interior structure of memory card 1a more clearly, and sealing resin to be used for mounting semiconductor chips is omitted.

As shown in FIG. 5 and FIG. 6, memory card 1a is equipped with first circuit board 2a different in shape from first circuit board 2 used in memory card 1 shown in FIG. 1 and FIG. 2. Memory card 1a includes cover 7a made of thermoplastic resin. The other structures remain unchanged from the structure shown in FIG. 1 and FIG. 2, so that they use the same reference marks as those in FIG. 1 and FIG. 2. A manufacturing method of memory card 1a is similar to that of memory card 1, so that the description thereof is simplified here.

As shown in FIG. 5 and FIG. 6, first circuit board 2a is shaped like a square "C", to be more specific, first circuit board 2 shown in FIG. 1 with its right end opened, namely, the right end of the circuit board shaped like a picture frame is opened. In memory card 1a, under face 32 of first semiconductor chip 3 confronts top face 21 of first circuit board 2a at a vicinity area of a pair of edges of under face 32 and another edge across the edges at right angles, so that a part of second semiconductor chip 5 does not overlap with first semiconductor chip 3. In other words, only a part of top face 51 of second semiconductor chip 5 confronts a part of another part other than the foregoing vicinity area of under face 32.

A method of manufacturing memory card 1a in accordance with the second exemplary embodiment is demonstrated hereinafter with reference to FIGS. 3A and 3B used in the first exemplary embodiment.

First, form bump 33 on an electrode on under face 32 of first semiconductor chip 3, and apply sealing resin 34 to electrode 211 on top face 21 of first circuit board 2a (step S11 and step S12). Then electrically connect first semiconductor chip 3 to first circuit board 2a with bump 33 therebetween, and harden sealing resin 34 thereby bonding first semiconductor chip 3 onto first circuit board 2a (step S13). First semiconductor chip 3 is thus mounted to first circuit board 2a through the foregoing steps.

Next, form bump 53 on under face 52 of second semiconductor chip 5, and apply sealing resin 54 to electrode 412 on top face 41 of second circuit board 4 (step S14 and step S15). Then electrically connect second semiconductor chip 5 to second circuit board 4 with bump 53 therebetween, and harden sealing resin 54 thereby bonding second semiconductor chip 5 onto second circuit board 4 (step S16). Second semiconductor chip 5 is thus mounted to top face 41 of second circuit board 4 through the foregoing steps.

Next, inspect electrically the quality of the mounting of first semiconductor chip 3 to first circuit board 2a via first circuit board 2a (step S17). In a similar way, inspect electrically the quality of the mounting of second semiconductor chip 5 to second circuit board 4 via second circuit board 4 (step S18).

Then apply solder to electrodes 411 and 413 on top face 41 of second circuit board 4 (step S19), and apply fixing member 8 formed of adhesive to top face 51 of second semiconductor chip 5 (step S20). First circuit board 2a and chip component 6 are mounted to second circuit board 4 before they undergo a reflow process, so that first circuit board 2a and chip component 6 are bonded to second circuit board 4 (step S21).

Then form cover 7a made of thermoplastic resin by an insert molding method for covering first semiconductor chip 3, first circuit board 2a, second semiconductor chip 5, and chip component 6 on second circuit board 4. Memory card 1a is thus manufactured through the foregoing steps.

As discussed above, according to the second exemplary embodiment and similar to the first exemplary embodiment, first semiconductor chip 3 can be layered on second semiconductor chip 5 without inserting a circuit board therebetween. Memory card 1a thus can be downsized and its thickness can be reduced. From the standpoint of downsizing and reducing the thickness of memory card 1a, at least a part of second semiconductor chip 5 can confront a part of another part other than the part confronting first circuit board 2a of under face 32 of first semiconductor chip 3. This structure allows inspecting electrically the quality of mounting of first semiconductor chip 3 and second semiconductor chip 5 individually before a memory module and a control module are layered together, so that the productivity can be improved and the manufacturing cost can be lowered.

According the second exemplary embodiment and similar to the first exemplary embodiment, first semiconductor chip 3 and second semiconductor chip 5 are mounted in a flip-chip manner, so that a degree of freedom can increase for selecting a material or a manufacturing method of the cover 7a. Further, the flip-chip mounting method expects higher reliability than the wire bonding mounting method. First semiconductor chip 3 is bonded to first circuit board 2a at the vicinity area of three edges of under face 32, so that first semiconductor chip 3 can be rigidly mounted to first circuit board 2a. First semiconductor chip 3 is bonded to second circuit board 4 with fixing member 8 made of adhesive, so that first semiconductor chip 3 can be further rigidly fixed, although indirectly, to second circuit board 4.

According to the second exemplary embodiment, cover 7a made of thermoplastic resin allows reducing the rigidity thereof, so that the reliability including safety can be improved.

The exemplary embodiments of the present invention are demonstrated hereinbefore; however, the present invention is not limited to the foregoing exemplary embodiments but various changes as described below are applicable to the invention: In the exemplary embodiments discussed previously, first semiconductor chip 3 and second semiconductor chip 5 work as a memory chip and a control chip respectively; however, the present invention is not limited to this example. For instance, other bare chips such as ASIC can be used as first semiconductor chip 3 and second semiconductor chip 5. Further, two memory chips are prepared, and they are layered together as first semiconductor chip 3 and second semiconductor chip 5, then they can be controlled by a control chip mounted to another area of second circuit board 4. As second semiconductor chip 5, another memory chip that stores information and also controls other memory chips, i.e. this memory chip does double duty as a control chip, can be mounted to second circuit board 4. At this time, the chip can use a semiconductor function in parts, and the chip as a whole does not necessarily include the semiconductor function.

Figure 7:
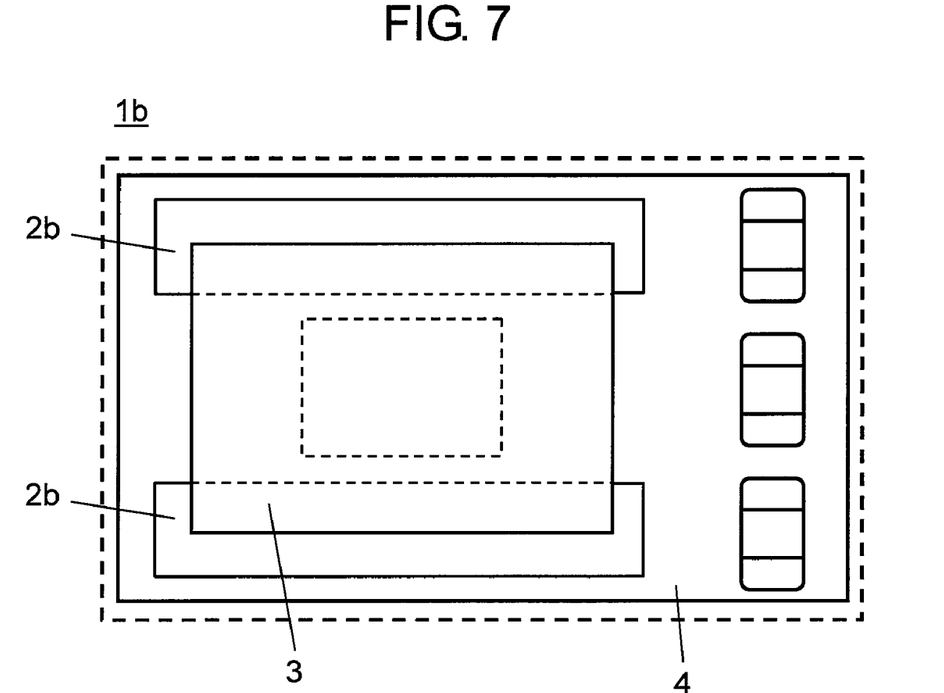
FIG. 7 shows a plan view illustrating another structure of a memory card in accordance with the second exemplary embodiment of the present invention.

In the previous exemplary embodiments, first semiconductor chip 3 is bonded to first circuit board 2 or 2a at the outer circumference, shaped like a picture-frame, of its under face 32 or the vicinity area of three edges of under face 32. However, the present invention is not limited to these examples. For instance, as shown in FIG. 7, first circuit board 2b formed of two boards placed in parallel with each other is bonded to second circuit board 4 such that a vicinity area of a pair of edges confronting each other of under face 32 of first semiconductor chip 3 confronts and bonds to first circuit board 2b.

In the previous exemplary embodiments, bumps 33 and 53 are formed on the electrode of first semiconductor chip 3 and the electrode of second semiconductor chip 5; however, those bumps can be formed on electrode 211 of first circuit board 2 and electrode 412 of second circuit board 4 respectively. Other types of bumps such as another ball bump, plated bump, or soldered bump can be used as bumps 33 and 53.

In the previous exemplary embodiments, NCF is used as the sealing resin; however, the present invention is not limited to this example, for instance, the sealing resin can be formed by applying non-conductive resin paste, anisotropic conductive resin film, or anisotropic conductive resin paste.

In the previous exemplary embodiments, first semiconductor chip 3 is mounted to first circuit board 2 or 2a before second semiconductor chip 5 is mounted to second circuit board 4; however, the present invention is not limited to these examples. For instance, second semiconductor chip 5 can be mounted to second circuit board 4 in parallel with the mounting of first semiconductor chip 3 to first circuit board 2 or 2a, or before the mounting of first semiconductor chip 3. The inspection of the mounting of first semiconductor chip 3 to the first circuit board can be done before the mounting of second semiconductor chip 5 to second circuit board 4, or in parallel with the mounting of second semiconductor chip 5.

In the previous exemplary embodiments, both of the first and second semiconductor chips are mounted in a flip-chip mounting method; however, the present invention is not limited to this example. At least one of the two mountings can be done by the wire bonding method when it is needed. However, from the standpoint of increasing the reliability of the mounting or a degree of freedom for selecting a material and a manufacturing method of cover, it is recommended that first semiconductor chip 3 and second semiconductor chip 5 be mounted to the circuit boards by the flip-chip mounting method.

In the previous exemplary embodiments, cover is formed of thermoplastic resin; however, the present invention is not limited to this example. Cover can be formed of thermosetting resin when it is needed; however, from the standpoint of manufacturing memory cards in the simpler way, cover is preferably formed of molded components. On top of that, from the standpoint of reducing the rigidity of cover for increasing safety, cover is preferably formed of thermoplastic resin. The memory card of the present invention can be used not only as an SD card, but also as other card-shaped memory media such as an IC card.

INDUSTRIAL APPLICABILITY

The present invention is useful for the technical field where memory media, such as a memory card for recording information, are required to be downsized or to be thinner.

The invention claimed is:

1. A memory card comprising:
a first circuit board;
a first semiconductor chip mounted to a top face of the first circuit board such that a part of an under face of the first semiconductor chip confronts the first circuit board;
a second circuit board on which an electrode protruding on a top face, and an electrode protruding on an under face of the first circuit board are bonded to each other by way of a solder;
a second semiconductor chip mounted on the top face of the second circuit board such that at least a part of the second semiconductor chip confronts a part of another part other than the part of the under face of the first semiconductor chip; and
a cover disposed over the top face of the second circuit board for covering the first semiconductor chip, the first circuit board, and the second semiconductor chip,
wherein the first circuit board and the second circuit board are connected between the electrodes only, and are not contacting with each other in other parts.

2. The memory card of claim 1, wherein the first semiconductor chip is mounted to the first circuit board with a bump sandwiched between the first semiconductor chip and the first circuit board, and the second semiconductor chip is mounted to the second circuit board with a bump sandwiched between the second semiconductor chip and the second circuit board.

3. The memory card of claim 1, wherein the cover is formed of a molded component and has a recess for accommodating the first semiconductor chip, the first circuit board, and the second semiconductor chip, and mounted to the second circuit board by using an opening of the recess.

4. The memory card of claim 1, wherein the cover is made of thermoplastic resin which is molded such that the first semiconductor chip, the first circuit board, and the second semiconductor chip are covered with the cover disposed over the second circuit board.

5. The memory card of claim 1 further comprising a fixing member disposed between the under face of the first semiconductor chip and a top face of the second semiconductor chip for fixing the first semiconductor chip and the second semiconductor chip to each other.

6. The memory card of claim 1, wherein the under face of the first semiconductor chip is rectangular, and a vicinity area of at least a pair of edges confronting each other of the under face confronts the first circuit board.

7. The memory card of claim 6, wherein an area shaped like a picture frame along an outer circumference of the under face of the first semiconductor chip confronts the first circuit board.

8. The memory card of claim 1, wherein the first semiconductor chip is a memory chip for storing information, and the second semiconductor chip is a control chip for controlling the first semiconductor chip.

9. The memory card of claim 1, wherein an opening is provided at a lateral side of the first circuit board.

10. A method of manufacturing a memory card comprising:
(a) mounting a first semiconductor chip on a top face of a first circuit board with a part of an under face of the first semiconductor chip confronting the first circuit board;
(b) mounting a second semiconductor chip on a top face of a second circuit board;
(c) bonding an electrode protruding on an under face of the first circuit board to an electrode protruding on the top face of the second circuit board by way of a solder, by setting at least a part of the second semiconductor chip oppositely to a region of other part than the region of the part of the under face of the first semiconductor chip, and forming a gap in other areas than between the electrodes; and
(d) covering the first semiconductor chip, the first circuit board, and the second semiconductor chip with a cover disposed over the top face of the second circuit board,
wherein the first circuit board and the second circuit board are bonded between the electrodes only.

11. The method of manufacturing a memory card of claim 10, wherein step (a) includes:
(a-1) forming a bump on one of an electrode of the first semiconductor chip and an electrode of the first circuit board;
(a-2) applying sealing resin to the electrode of the first circuit board; and
(a-3) coupling electrically the first semiconductor chip to the first circuit board with the bump between the first semiconductor chip and the first circuit board,
wherein step (b) includes:
(b-1) forming a bump on one of an electrode of the second semiconductor chip and an electrode of the second circuit board;
(b-2) applying sealing resin to the electrode of the second circuit board; and
(b-3) coupling electrically the second semiconductor chip to the second circuit board with the bump sandwiched between the second semiconductor chip and the second circuit board.

12. The method of manufacturing a memory card of claim 10 further comprising:
electrically inspecting quality of mounting of the first semiconductor chip to the first circuit board via the first circuit board, between step (a) and step (c); and
electrically inspecting quality of mounting of the second semiconductor chip to the second circuit board via the second circuit board, between step (b) and step (c).

* * * * *